United States Patent [19]

Fukumitsu et al.

[11] Patent Number: 4,657,805
[45] Date of Patent: Apr. 14, 1987

[54] DUST COVER SUPERIOR IN TRANSPARENCY FOR PHOTOMASK RETICLE USE AND PROCESS FOR PRODUCING THE SAME

[75] Inventors: Yasunori Fukumitsu, Yokosuka; Mitsuo Kohno, Yokohama, both of Japan

[73] Assignee: Asahi Kasei Kogyo Kabushiki Kaisha, Osaka, Japan

[21] Appl. No.: 749,623

[22] PCT Filed: Oct. 12, 1984

[86] PCT No.: PCT/JP84/00485
§ 371 Date: Jun. 13, 1985
§ 102(e) Date: Jun. 13, 1985

[30] Foreign Application Priority Data

Oct. 13, 1983 [JP] Japan ................ 58-189892

[51] Int. Cl.⁴ ............................. B32B 7/02
[52] U.S. Cl. ..................... 428/215; 428/422; 355/30; 352/130
[58] Field of Search ............ 428/421, 422; 355/30; 352/130, 232; 430/5

[56] References Cited

U.S. PATENT DOCUMENTS

| | | | |
|---|---|---|---|
| 4,131,363 | 12/1978 | Shea et al. | 355/53 |
| 4,444,826 | 4/1984 | Sasaki et al. | 428/421 |
| 4,465,759 | 8/1984 | Duly et al. | 430/321 |

OTHER PUBLICATIONS

"Pellicle Protection of IC Masks", Ron Hershel, Hershel Consulting, Inc., Aug. 1981, pp. 97-106.
"Pellicle Mask Protection for 1:1 Projection Lithography", T. A. Brunner, C. P. Ausschinitt and D. L. Duly, Solid State Technology, May 1983, pp. 135-143.

*Primary Examiner*—Edith Buffalow
*Attorney, Agent, or Firm*—Birch, Stewart, Kolasch & Birch

[57] ABSTRACT

In a dust cover for photomask reticle purposes which consists essentially of a supporting frame and a thin film bonded to a surface of the frame, the dust cover is improved in transparency by constructing at least the outermost layers of the thin film with thin films of a fluoropolymer which exhibits an average transmittance of at least 90% for rays of wavelengths from 240 to 290 nm and an average transmittance of at least 93.5% for rays of wavelengths from 290 to 500 nm, when having a thickness of 10 μm, and has a refractive index of up to 1.42.

24 Claims, 9 Drawing Figures

[4,657,805]

DUST COVER SUPERIOR IN TRANSPARENCY FOR PHOTOMASK RETICLE USE AND PROCESS FOR PRODUCING THE SAME

TECHNICAL FIELD

The present invention relates to a dust cover superior in transparency for photomask reticle use. More particularly, the invention relates to such a dust cover comprising a film having at least thin outermost layers of a specific fluoropolymer, the film being bonded to a supporting frame.

BACKGROUND ARTS

With the densification of integrated semiconductor circuits in recent years, printed wires in the circuits have been extremely fined to widths of from 1 to 3 $\mu$m and the lithographic technique of forming images of such wires on wafers are being changed from the projection system to the stepper system.

When dust is present on a photomask reticle in the lithographic process, images of dust particles will also be formed, resulting in short circuits and defects in the produced circuit, and this will lower the yield of the LSI. Specially in the stepper system, several images on a reticle are successively projected on a reduced scale to a wafer. Hence one dust particle on a reticle may make defective all the resulting LSI's. Thus it is getting very important to reduce the dust to zero.

Thereupon, a method for preventing dust adhesion onto photomask reticles (hereinafter abbreviated occasionally as "mask") has been proposed (U.S. Pat. No. 4,131,363). The method comprises arrangement of a transparent film or films over one or both sides of the mask with a space left between the film and the mask surface. According to this method, since dust adheres only to the transparent film, defects due to dust can be prevented by focussing projecting rays on the image prepared on the mask and bringing the dust adhering onto the film out of focus, so that the image of the dust is not formed on the wafer.

The dust cover, applied to the mask, is set in an exposer. The film, which is the principal part of the dust cover, is disposed in the optical path of exposure light.

Consequently, the film needs to transmit light without causing the distortion or disorder of image, have a uniform thickness, and be free of foreign matter, fault, and internal strain.

The transparency of the film to the exposure light is also important. That is, when the transparency is low, the exposure needs to be the longer and therefore the throughput will be the less. In the production of LSI, it is very important to raise the throughput since LSI's in many cases are produced in extremely large volumes. Specially in the stepper system, the exposure in some cases is repeated hundreds of times per one wafer and the improved transparency of the dust cover film hence contributes greatly to the rise in the throughput.

For the film of the dust cover, nitrocellulose is in use. Although nitrocellulose is used because of the high film strength thereof and the capability thereof to give very uniform films, the light transmittance of these films is about 92% at wavelengths of from 350 to 450 nm which are of the exposure light used today. Thus nitrocellulose films as such are insufficient in light transmittance for use as the film of the dust cover. In consequence, a method has been proposed, in which the interference of two light waves reflected from the front and rear surfaces of the film is utilized, that is, the film thickness is chosen so that these reflected waves will cancel each other (U.S. Pat. No. 4,378,953). According to this method, the light transmittance rises to 99% while the film thickness becomes 0.865 $\mu$m, being extremely thin. Hence this method has the drawback of requiring the exercise of sufficient care in handling such a dust cover. On the other hand, the increase in the film thickness will extremely narrow the tolerance of the thickness in order to achieve a light transmittance of 98% or more, thus making the film production very difficult. In addition, if the film thickness is increased to 6 $\mu$m or more, the light transmittance thereof will be lowered on account of minute dimensional roughness of the film surface.

Another method is to prevent the reflection with an inorganic compound layer formed by vapor deposition or the like on both sides of a nitrocellulose film. This method is an application of the technique used for optical lens and eyeglasses. According to this method, the reflection of light of any possible wavelength as desired can be prevented by choosing the thickness of the anti-reflection layer and a light transmittance of 98% or more can be attained for a relatively thick film.

In order to form such films, however, an expensive apparatus such as a vacuum deposition arrangement is necessary and additionally the vapor deposition needs to be carried out at a low temperature so as not to impair the cellulose film. In the low temperature vapor deposition, the inorganic compound to coat is not densely deposited and the refractive index of the deposit layer varies with the temperature condition. Hence the deposit layer may not exhibit the intended anti-reflection function. Moreover, the deposited material, depending on the nature thereof, may be oxidized with air, resulting in a change in the refractive index. Accordingly, the function of the resulting dust covers is not definite.

On the other hand, as LSI's are more densified, there is a growing demand for printed wire widths of submicron order. To meet such a demand, rays of wavelengths from 350 to 450 nm used today for the exposure do not have enough resolving power and rays of shorter wavelengths, i.e. ultraviolet rays of wavelengths from 240 to 290 nm need to be used. However, nitrocellulose films show rapid decrease in the light transmittance with decrease in wavelength from 300 nm and are degraded by far ultraviolet rays to such an extent that it can be no longer used. Therefore a novel dust cover is looked for.

DISCLOSURE OF THE INVENTION

According to the present invention, there is provided a dust cover superior in transparency for photomask reticle purposes, which consists essentially of a supporting frame and a thin film bonded to edge areas thereof, said thin film consisting of either a single layer of a fluoropolymer which exhibits an average transmittance of at least 90% for rays of wavelengths from 240 to 290 nm and an average transmittance of at least 93.5% for rays of wavelengths from 290 to 500 nm, when having a thickness of 10 $\mu$m, and has refractive index of up to 1.42 or three or more multilayers both the outermost layers of which are formed of the above-defined fluoropolymer. The anti-reflection dust cover consisting essentially of a layer formed of the above fluoropolymer and a supporting frame and the anti-reflection dust cover having a thin film of the above fluoropolymer as the core layer are superior in transparency to far ultraviolet rays of wavelengths from 240 to 290 nm. Dust covers of constant quality, without being varied in the anti-reflection function, having improved transparency to rays of wavelengths from 350 to 450 nm used today for the exposure can also be formed by covering both sides of thin nitro-cellulose films with the fluoropolymer. The present invention also provides a process for producing a dust cover superior in transparency for photomask reticle use, characterized in that each layer of the film, which is the principal portion of the dust cover, is formed from a solution of the prescribed polymer in a solvent by a coating method, preferably the spinner coating method. According to the process of the invention, each layer can be formed with ease and high reproducibility.

BRIEF DESCRIPTION OF THE DRAWINGS

In FIGS. 1 to 4, numerals denote the following:

Figure 1:
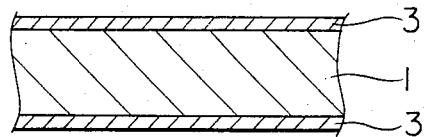
FIG. 1 is an enlarged sectional view showing an example of the film which is an important element of the present invention.

1: core film, 2: intermediate layers, 3: outmost layers, 4: film, 5: frame, 6: bond layer, 7: bond layer, 8: protective film, 9: mask, 10: image.

BEST MODE FOR CARRYING OUT THE INVENTION

Since the transparency of a film to light is lowered with the absorption, scattering, and reflection of the light by the film, a dust cover superior in transparency can be obtained by eliminating completely or partly these phenomena.

The ability of a film to absorb light is a property of the film itself. Hence, it is necessary to choose a polymer superior in transparency in order to use as a film for the dust cover. Films in use today for the dust covers are those of nitrocellulose. Nitrocellulose, although superior in transparency to rays of wavelengths from 350 to 450 nm, absorbs markedly far ultraviolet rays of wavelengths up to 300 nm and therefore cannot be used for the dust cover in these wavelength region. In contrast to this, the fluoropolymer used in the present invention scarcely absorbs far ultraviolet rays of wavelengths from 240 to 290 nm, being superior in transparency to these rays.

The scattering of light by a polymer is attributable to dust contained in the polymer and to crystals of the polymer. The dust in polymers can be removed by methods such as through purification. The problem of polymer crystals does not arise when the polymer is amorphous. Hence amorphous polymers are much preferred though a crystalline polymer may be used satisfactorily if it can be brought into an amorphous state by quenching or some other method.

On the other hand, the reflection of light by a polymer is attributable to the refractive index of the polymer; the higher the refractive index the greater the reflectivity. Since the refractive index of nitrocellulose is about 1.5, the reflectivity of films thereof will be about 8% and hence the average light transmittance of these films will be up to 92% in the wavelength region of from 350 to 450 nm wherein the absorption or the scattering is not caused by these films. In contrast, the fluoropolymer used in the present invention, having a low refractive index of up to 1.42, will show a low reflectivity of up to about 6% and an average light transmittance of about 94% or higher.

As described above, the dust cover of the present invention comprising a film of a specific fluoropolymer as the principal portion shows superor transparency to not only far ultraviolet rays of wavelengths from 240 to 290 nm but also rays, used today for the exposure, of wavelengths from 350 to 450 nm.

Any fluoropolymer may be used in the present invention that has an average light transmittance of at least 90% for rays of wavelengths from 240 to 290 nm and an average light transmittance of at least 93.5% for rays of wavelengths from 290 to 500 nm, when having a thickness of 10 $\mu$m, and has a refractive index of up to 1.42. Examples of such fluoropolymers are a tetrafluoroethylene (TFE) - hexafluoropropylene (HFP) copolymer, vinylidene fluoride homopolymer, vinylidene fluoride (VdF)-TFE copolymer, TFE-perfluoroalkyl vinyl ether copolymer, and VdF-ethylene copolymer. Preferred fluoropolymers that can be dissolved in solvents and formed into uniform films by a coating method, particularly by the spinner coating method, are a vinylidene fluoride homopolymer, vinylidene fluoride-tetrafluoroethylene copolymer wherein the content of vinylidene fluoride is at least 50 mole %, and tetrafluoroethylene (TFE)-hexafluoropropylene (HFP) - vinylidene fluoride (VdF) terpolymer wherein the content of tetrafluoroethylene is from 35 to 65 mole % and the molar ratio of HFP to VdF is from 1:1 to 1:2.3.

A dust cover further superior in transparency, when necessary, can be obtained by making the film, which is the principal portion of the cover, into a multilayer film having layers of the fluoropolymer, used in the present invention, on the outermost sides. That is, since the fluoropolymer, as stated above, is superior in transparency to rays over a wide wavelength range from far ultraviolet rays to ordinary ultraviolet rays and has a low refractive index, the reflection can be prevented by disposing films of the fluoropolymer as the outermost layers and canceling the reflected waves with each other; thus the resulting multilayer film will show better transparency. This is based fundamentally on the same theory as in the case of the above-mentioned anti-reflection dust cover formed by vapor deposition of an inorganic compound on a nitrocellulose film. According to the present invention, however, the anti-reflection layers are formed of the polymer, thereby an expensive apparatus such as a vacuum deposition arrangement being not required, and a more important matter is that all the layers are formed of polymers and therefore the anti-reflecting function scarcely varies and dust covers having constant functions are obtainable. This is a great advantage of the invention.

As shown in FIG. 1, an example of the structure of the film which is the principal portion of such an anti-reflection dust cover is formed by disposing the outermost layers 3 of a polymer on both sides of a core film 1, the polymer film having a reflactive index lower than that of the film 1 and an optical thickness (refractive index × thickness) corresponding to ¼ of the wavelength of the light to be prevented from reflection. Since the accuracy of this thickness much affects the anti-reflecting function, the satisfactory anti-reflecting function will not be afforded unless the thickness is controlled to suppress the deviation from the prescribed thickness within 10%. When the light to be prevented from reflection is a usual ultraviolet ray having a wavelength of 350 to 450 nm, a nitrocellulose film of 0.5 to 15 μm in thickness is used as the core film 1 and the above-mentioned fluoropolymer is used for the films 3 to be disposed separately on both sides thereof. In this case, the conditions for the complete prevention of the reflection are:

$$n_3 = \sqrt{n_1}$$

$$n_3 d_3 = \tfrac{1}{4}\lambda(2N+1)$$

wherein $n_1$ is the refractive index of the core film 1, $n_3$ is the refractive index of the film 3 to be disposed on both sides of the film 1, $d_3$ is the thickness of the films 3, λ is the wavelength of the light to be prevented from reflection, and N is 0.1, or 2. Since the refractive index of nitrocellulose is 1.5, no substance satisfying the condition of $n = \sqrt{1.5}$ exists and hence the complete prevention of reflection is impossible. However, the fluoropolymer has considerable anti-reflection effect since the refractive index thereof as low as 1.42 or less and the average light transmittance of the whole film will be at least about 96%, being improved by about 4% or more over the film formed of nitrocellulose alone. The value of N in the above equation is preferably 0. Although the anti-reflecting effect is also produced when N is 1 or 2, the wavelength range of rays on which the effect is observed will be restricted and the tolerance of the thickness will narrower, thus making the production difficult.

Figure 2:
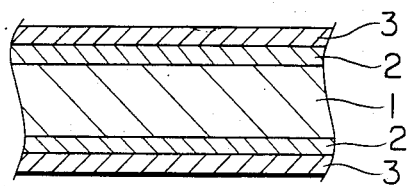
FIG. 2 is an enlarged sectional view showing another example of the film which is an important element of the invention.

Another example of the film, as shown in FIG. 2, can be formed by disposing intermediate layers 2 of a polymer on both sides of a core film 1, the polymer having a refractive index higher than that of the core film 1, and disposing the outermost layers 3 of another polymer on the outsides of the intermediate layers 2, the latter polymer having a refractive index equal or lower than that of the core film 1, and the optical thickness of each of the intermediate and outermost layers corresponding to ¼ of the wavelength of the light to be prevented from reflection. That is, when the light to be prevented from reflection is a far ultraviolet ray having a wavelength of 240 to 290 nm, the fluoropolymer is used for the core film 1, a transparent polymer having a refractive index of at least 1.45 is used for the intermediate layers 2 to be disposed on both sides of the core film 1, and the fluoropolymer is used for the outermost layers 3. When the light to be prevented from reflection is a usual ultraviolet ray having a wavelength of 350 to 450 nm, the above-mentioned three-layer film can of course be used while a five-layer film may also be formed by using nitrocellulose for the core film 1, a transparent polymer having a refractive index of at least 1.57 for the intermediate layers 2 on both sides of the core film 1, and the fluoropolymer for the outermost layers 3 on the outer sides of the intermediate layers 2.

The conditions for preventing the reflection with the film of such a structure are:

$$n_2/n_3 = \sqrt{n_1}$$

$$n_2 d_2 = n_n d_3 = \tfrac{1}{4}\lambda(2N+1)$$

wherein $n_1$ is the refractive index of the core film 1, $n_2$ is the refractive index of the intermediate layers 2, $d_2$ is the thickness thereof, $n_3$ is the refractive index of the outermost layers 3, $d_3$ is the thickness thereof, λ is the wavelength of the light to be prevented from reflection, and N is 0, 1, or 2. In practice, the multilayer film shows a superior anti-reflecting function without complete satisfaction of the above equations, provided that the refractive index of each layer is chosen to approximate to the proper value. The value of N in the above equation is preferably 0. Although the anti-reflecting effect is also produced when N is 1 or 2, the wavelength range of rays on which the effect is observed will be restricted and the tolerance of the thickness will be narrower, thus making the production difficult.

For instance, when the core film 1 is formed of the fluoropolymer having a refractive index of 1.37, the intermediate layers 2 are formed of a polymer having a refractive index of 1.47, and the outermost layers 3 are formed of the same fluoropolymer as that of the core film 1, the average transmittance of the whole film will be 96.5% at 280 nm, being improved by 2% or more over that of the single film. When the refractive index of the intermediate layers 2 is lower than 1.45, or when the refractive index of the outermost layers is higher than that of the core film 1, the anti-reflecting effect will be practically lost or on the contrary, the reflection may become increased sometimes. Hence great care must be taken in selecting the refractive index of each layer.

Further, for instance, when the core film 1 is formed of nitrocellulose, the intermediate layers 2 are formed of a polymer having a refractive index of 1.59, and the outermost layers 3 are formed of the fluoropolymer having a refractive index of 1.37, the whole film will show a transmittance of 99.5% for the ray of wavelength 436 nm which is in use today as a light source for exposure in the stepper system.

When the core portion is formed of the fluoropolymer, any polymer, which has a refractive index of at least 1.45 and well transmits far ultraviolet rays of wavelengths from 240 to 290 nm, may be used for the intermediate layers 2. Examples of such polymers are ethylcellulose and acetylcellulose and the like. When the core film 1 is formed of nitrocellulose, there may be used, for the intermediate layers 2, a polymer which has a refractive index of at least 1.57 and well transmits usual ultraviolet rays of wavelengths from 350 to 450 nm. Such polymers include, for example, polystyrene, polysulfone, polyethersulfone, polyphenylene ether, polycarbonate, and aromatic polyester.

As the thickness of the films used in the present invention, a film of the fluoropolymer, when used singly or as the core film, is desirably from 1 to 15 μm, and a film of nitrocellulose, when used as the core film, is desirably from 0.5 to 15 μm. When the thickness of each film is less than the above value, the film strength will be too low for easy handling, and when the thickness exceeds the above value, a uniform film of good precision is hard to form, such thickness being of no advantage.

The deviation in the position of the mask image projected, viz, the focus shift with an increase in the film thickness is as small as about 0.1 to 0.2 μm in the stepper system even when the film thickness is 15 μm. Thus the film thickness has little effect on the image formation.

Figure 3:
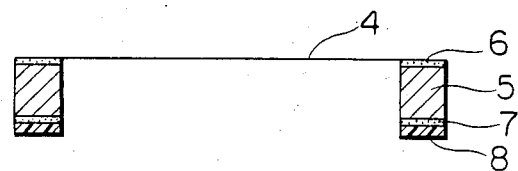
FIG. 3 is a cross-sectional view of the entire body of the dust cover.
Figure 4:
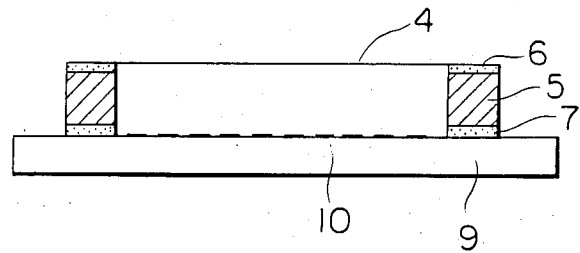
FIG. 4 is a cross-sectional view showing an embodiment of using the dust cover of the invention.

The structure of the portion other than the film portion, of the dust cover is as shown in FIG. 3, being fundamentaly the same as used conventionally. In the dust cover structure, the film 4 is fixed through a bond layer 6 on a supporting frame 5 without forming any wrinkle or sagging. On the other side of the supporting frame, a sticky layer 7 is formed and overlaid with a protective film 8. The supporting frame 5 is usually made of an aluminum alloy or a plastic, and has a diameter of 1 to 6 inches or a square of about 1 to 6 inches and a height of about 2 to 10 mm The dust cover is contained in a clean case until use to be protected from dust. When using, the protective film 8 shown in FIG. 3 is peeled off. The dust cover of the present invention is set to cover an image 10 on a mask 9. The mask and the dust cover is stored also in the form shown in FIG. 4, thereby preventing the dust adhesion to the image area and making the mask cleaning unnecessary before reusing.

Methods applicable to the production of the films in various embodiments described above include solution cast methods such as the spinner coating method, the coater method using a knife coater, rod coater, or the like, and the dip coating method, when the polymer to use is soluble in a solvent; and melt extrusion methods such as the T-die extrusion method and the inflation extrusion method, when the polymer is a thermoplastic resin. Of these methods, the spinner coating method in solution cast methods is most recommendable since the accuracy of film thickness and the uniformity of film thickness are very important for the film used in the present invention and the production of the film free of dust and faults is essential.

The spinner coating method comprises dissolving a polymer in a solvent, dropping this solution on a flat and smooth substrate or on an already formed film, and rotating the substrate or the film at a suitable number of revolutions, thereby forming a film of a desired thickness. According to this method, dust and the like can be removed completely by filtering the solution and the development of faults and the like can be reduced to zero by using a cleaned silicon wafer or a smooth glass plate as the substrate and additionally a desired thickness of the film can be obtained by proper selection of the solution concentration and the number of revolutions for coating. Moreover the uniformity of film thickness is satisfactory.

When the film is formed only of a layer of the fluoropolymer, the dust cover is made in such way that a film of the polymer is formed on a smooth substrate such as a silicon wafer by the spinner coating method or the like, the surface of an adhesive previously applied on a supporting frame is brought into contact with a surface of the film to bond the film to the frame, and the assembly is dipped in water to separate the film from the substrate. When the film is of a multilayer type, the dust cover is made in such way that the core film is formed on the substrate, and after the intermediate layer has been formed on one side of the core film or without forming the intermediate layer, the outermost layer is formed thereon, the supporting frame is bonded through an adhesive to a surface of the resulting film, the substrate is separated from the film, and then the other side of the core film is overlaid successively with or without the intermediate layer, and with the outermost layer, in the same manner as above.

The present invention is illustrated in more detail with reference to the following examples.

In the following examples and comparative examples, the film thickness was determined in the following manner:

When the film was relatively thin and interference waves were observed in the measurement with a spectrophotometer (UV-240, supplied by Shimazu Co., Ltd.), the thickness of the film was calculated according to the following equation:

$$d = K\lambda_1\lambda_K/2n(\lambda_1 - \lambda_K)$$

d: Film thickness (nm)
$\lambda_1$: Peak wavelength (nm) of interference waves in the vicinity of D-line (587.6 nm).
$\lambda_K$: Wavelength (nm) of K-th peak from $\lambda_1$
n: Refractive index of film When the film was relatively thick and the interference wave was not observed, the film thickness was measured with a Schopper type of thickness gage.

EXAMPLE 1

A 20 wt % solution of a tetrafluoroethylenevinylidene fluoride copolymer (supplied by Pennwalt Corp. under the tradename of Kynar 7201, TFE content about 10 mole %, refractive index 1.40) was prepared by dissolving the copolymer in methyl ethyl ketone.

A silicon wafer was set in a spin coater, the above solution was dropped on the wafer, and the wafer was rotated to form a thin coat on the wafer. This coat was dried by heating with an infrared lamp, and an aluminum supporting frame one side of which had been coated with an epoxy adhesive was placed on the dried coat to bond itself thereto, and the adhesive was cured.

This assembly was immersed in water and allowed to stand for 30 minutes. Then the wafer peeled off, and the film-supporting frame was withdrawn from the water and air-dried to make up a dust cover, which comprised the supporting frame and the film supported thereby.

Figure 5:
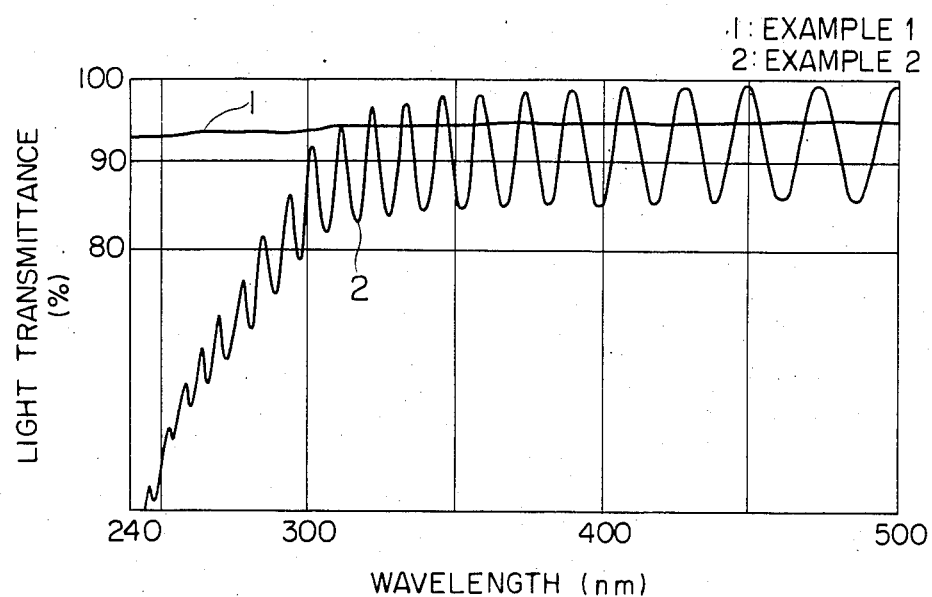
FIG. 5 shows the relation between wavelength and light transmittance measured on the dust covers of Example 1 and of Comparative Example 1.

The thickness of this film was about 14 μm, no interference wave due to the film was observed in measurement with a spectrophotometer, and the transmittance for light of wavelength 240 μm was 92.5% and the average transmittance for light of wavelengths from 350 to 450 nm was 94.5%. Thus the film showed a superior function over a wide range of from a far ultraviolet region to an ultraviolet region (see FIG. 5).

COMPARATIVE EXAMPLE 1

A 10 wt % solution of nitrocellulose (HIG-20, supplied by Asahi Kasei Kogyo Co., Ltd.) was prepared by dissolving it in n-butyl acetate.

Using this solution, a dust cover was made in the same manner as in Example 1.

The film of the obtained dust cover was 2.861 μm in thickness and showed interference waves. The film was found to have a transmittance of 35% for light of wavelength 240 nm and a maximum transmittance of 98.2%, minimum transmittance of 84.8%, and average transmittance of 91.5%, in the vicinity of a wavelength of 350 nm, and an average transmittance of 92.0% for light of wavelengths from 350 to 450 nm (see FIG. 5).

EXAMPLE 2

A tetrafluoroethylene (TFE)-hexafluoropropylene (HFP)-vinylidene fluoride (VdF) mixture was polymerized at 85° C. by using a fluorine-containing surfactant ($C_8F_{17}COONH_4$, supplied by 3M Co. under the tradename of Fluorad FC-143) as emulsifier, ammonium persulfate as initiator, and diethyl malonate as chain transfer agent. The TFE/HFP/VdF molar ratio in the obtained terpolymer was calculated as 48.2/20.1/31.7 from the balance of each monomer. The refractive index of this terpolymer was 1.36. This terpolymer was dissolved in perfluoro-2-methyl-1-oxy-3-thiacyclohexane-3,3-dioxide

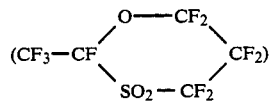

to prepare a 3 wt % solution.

A dust cover was made by treating this solution in the same manner as in Example 1.

In spectrophotometry of the film of the obtained dust cover, interference waves were observed, and the film thickness was calculated as 2.04 μm. The film was found to have a transmittance of 93.1% on average for light of wavelength 240 nm and an average transmittance of 95% for light of wavelengths from 350 to 500 nm.

EXAMPLE 3 AND COMPARATIVE EXAMPLE 2

A 7 wt % solution of nitrocellulose (H-20, supplied by Asahi Kasei Kogyo Co., Ltd.) was prepared by dissolving it in n-butyl acetate. Also an 0.6 wt % solution of a TFE/HFP/VdF terpolymer (TFE-49.2 mole %, HFP=19.1 mole %, VdF=31.7 mole %, $N_D=1.35$) was prepared by dissolving it in perfluoro-2-methyl-1-oxy-3-thiacyclohexane-3,3-dioxide.

A silicon wafer (125 mm $\phi$) was set in a spin coater, and the above nitrocellulose solution was dropped on the wafer to form a uniform nitrocellulose coat on the wafer. The coat was dried by heating with an infrared lamp. On the dried coat was dropped the solution of the TFE/HFP/VdF terpolymer. The wafer was rotated at 700 rpm for 20 seconds. Then this coat was dried by heating with an infrared lamp. An aluminum ring (supporting frame) of 100 mm $\phi$ (outer diameter) coated with an epoxy adhesive was placed on the terpolymer coat, and the adhesive was cured.

This assembly was immersed in water and allowed to stand for 30 minutes, and then the wafer was separated from the film. The film bonded to the aluminum ring was withdrawn from the water, air-dried, and set again in the spin coater with itself positioned on the upper side. The solution of the TFE/HFP/VdF terpolymer was dropped, and formed into a film by rotation under the same conditions as above. The coat was then dried to make up the intended dust cover.

Figure 6:
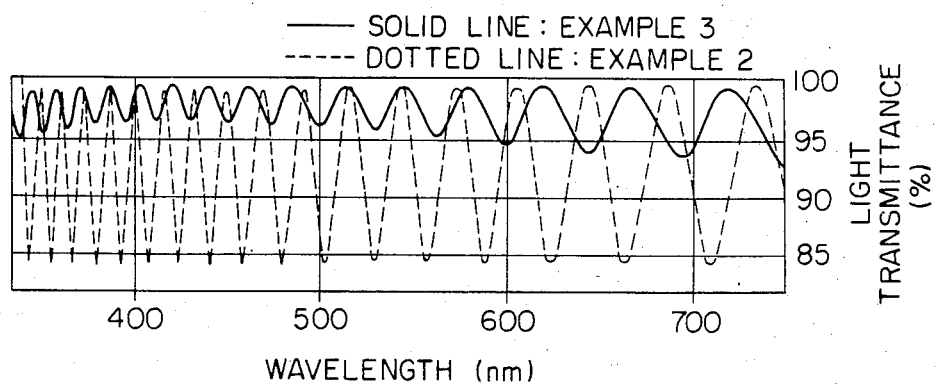
FIG. 6 shows the relation between wavelength and light transmittance measured on the dust covers of Example 3 and of Comparative Example 2.

As is evident from FIG. 6, this anti-reflection film was found from spectrophotometry to have transmittance of from 96.5 to 99.5% and an average transmittance of 98%, in the vicinity of a wavelength of 400 nm. On the other hand, in spectrophotometry of a dust cover having a nitrocellulose film alone on which the TFE/HFP/VdF terpolymer was not applied, large interference waves were observed and thus the transmittance ranged from 84 to 99% and the average transmittance was 92%.

EXAMPLE 4

A dust cover was made by repeating the procedure of Example 3 but using a solution of a TFE/VdF copolymer (TFE content - 38.7 mole %, $n_D=1.40$) in hexamethylphosphoric acid triamide in place of the TFE/HFP/FdF terpolymer. From spectrophotometry of this dust cover, the transmittance in the wavelength region of from 350 to 450 nm was from 92.5 to 99.5% and the average transmittance was 96%, proving the anti-reflection effect.

EXAMPLES 5, 6, 7, 8 and 9

A 9 wt % solution of nitrocellulose (H-20, supplied by Asahi Kasei Kogyo Co., Ltd.) was prepared by dissolving it in ethyl lactate. A polystyrene (GP-683, supplied by Asahi Kasei Kogyo Co., Ltd., $n_D=1.59$), polysulfone (P-3500, supplied by Nissan Chemicals Co., Ltd., $n_D=1.63$), polyethersulfone (P-200, supplied by ICI Co., Ltd., $n_D=1.63$), polycarbonate (1250, supplied by Teijin Co., Ltd., $n_D=1.59$), and polyphenylene ether (supplied by Asahi Kasei Kogyo Co. Ltd. under the tradename of Xyron T-1045, $n_D=1.59$) were each dissolved in 1,1,2,2-tetrachloroethane to prepare 0.75 wt % solutions. Further a TFE/HFP/VdF terpolymer (TFE - 44.2 mole %, HFP - 20.7 mole %, VdF - 35.1 mole %, $n_D=1.37$) was dissolved in perfluoro-2-methyl-1-oxy-3-thiacyclohexane-3,3-dioxide to prepare a 0.6 wt % solution.

Using a spin coater, a film of nitrocellulose, a film of one of the polymers (polystyrene, polysulfone, polyethersulfone, polycarbonate, and polyphenylene ether) as an intermediate layer, and a film of the TFE/HFP/VdF terpolymer were formed successively from the above solutions over a silicon wafer. An aluminum ring was bonded to the resulting laminate in the same manner as in Example 3, and the silicon wafer was separated from the laminate film in water. Further an intermediate layer and a layer of the TFE/HFP/VdF terpolymer were formed by using the spin coater. In this manner, dust covers having a nitrocellulose film as the central layer were made up. Found spectral characteristics of these covers were as shown in Table 1. Any of these covers showed a minimum light transmittance of at least 98%, thus having sufficient performance characteristics as a dust cover for the stepper system.

TABLE 1

| Example No. | Polymer for intermediate layer | Light transmittance (%) (436 nm) | | |
|---|---|---|---|---|
| | | Minimum | Maximum | Average |
| 5 | Polystyrene | 98.3 | 99.5 | 98.9 |
| 6 | Polysulfone | 99.5 | 99.5 | 99.5 |
| 7 | Polyethersulfone | 99.5 | 99.5 | 99.5 |
| 8 | Polycarbonate | 98.9 | 99.8 | 99.5 |
| 9 | Polyphenylene ether | 99.0 | 99.8 | 99.4 |

EXAMPLE 10 AND COMPARATIVE EXAMPLE 3

Figure 7:
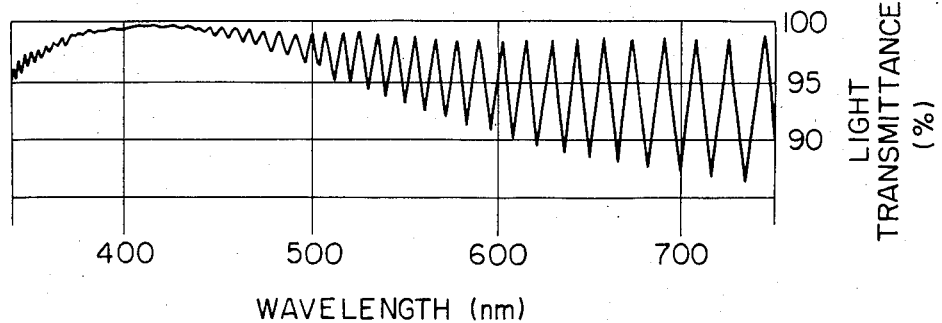
FIG. 7 shows the relation between wavelength and light transmittance measured on the dust cover of Example 10.
Figure 8:
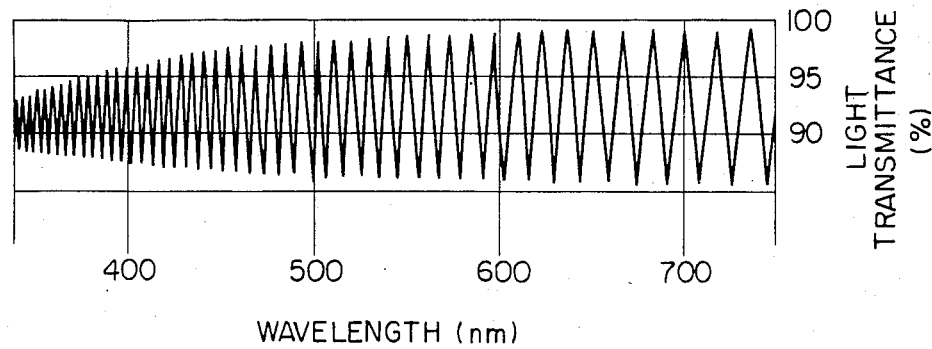
FIG. 8 shows the relation between wavelength and light transmittance measured on the dust cover of Comparative Example 3.

A dust cover was made in the same manner as in Example 6 except that the concentration of the nitrocellulose solution was changed to 14 wt %. Data of spectrophotometry of the formed film are shown in FIG. 7. Data of the nitrocellulsoe film alone which is the core of the laminate film are shown in FIG. 8. From FIG. 8, the thickness of the nitrocellulose film was calculated as 9.5 μm and the average transmittance in the vicinity of a wavelength of 436 nm was as low as 91.5% (Comparative Example 3).

In contrast, while the thick of the core nitrocellulose film in Example 10 was assumed to be similarly 9.5 μm, the transmittance at a wavelength of 436 nm was as high as 99.5% in spite of such a heavy thickness of the film.

EXAMPLE 11

The TFE/VdF copolymer of Example 1 was dissolved in ethyl methyl ketone to prepare a 20 wt % solution thereof. Acetylcellulose (refractive index 1.48) was dissolved in an ethyl lactate/n-butyl acetate/ethanol (40/35/25 in weight ratio) mixed solvent to prepare an 0.6 wt % solution thereof. Further the TFE/HFP/VdF terpolymer of Example 2 was dissolved in perfluoro-2-methyl-1-oxy-3-thiacyclohexane-3,3-dioxide to prepare an 0.6 wt % solution thereof.

Using these solutions, a multilayer dust cover having a film of the TFE/VdF copolymer as core layer, acetylcellulose films as intermediate layers, and films of the TFE/HFP/VdF terpolymer as outmost layers was made in the same manner as in Example 5.

Figure 9:
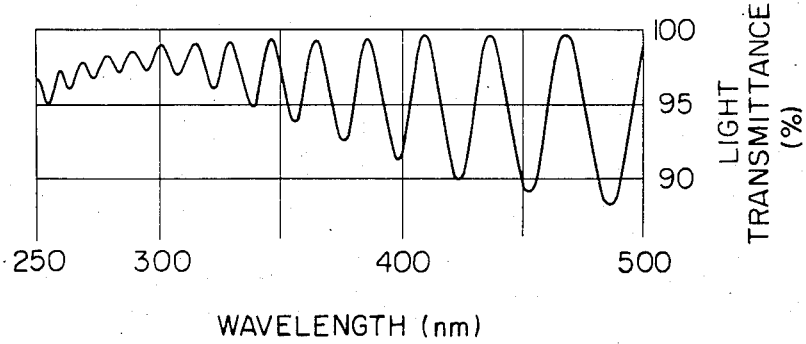
FIG. 9 shows the relation between wavelength and light transmittance measured on the dust cover of Example 11.

The thickness of the core TFE/VdF copolymer film was 2.25 μm and the transmittance of the cover at a wavelength of 280 nm was on average 97.5% (see FIG. 9).

We claim:

1. A dust cover superior in transparency for photomask reticle purposes, which consists essentially of a supporting frame and a thin film bonded to edge areas thereof, said thin film consisting of either a single layer of a fluoropolymer which exhibits an average transmittance at least 90% for rays of wavelengths from 240 to 290 nm and an average transmittance of at least 93.5% for rays of wavelengths from 290 to 500 nm, when having a thickness of 10 μm, and has a refractive index of up to 1:42 or three or more multilayers both the outermost layers of which are formed of the above-defined fluoropolymer.

2. The dust cover of claim 1, wherein said thin film is of a single layer structure having a thickness of 1 to 15 μm.

3. The dust cover of claim 1, wherein said thin film has a three-layer structure and the core layer thereof is a nitrocellulose film having a thickness of 0.5 to 15 μm.

4. The dust cover of claim 3, wherein both the outermost layers has an optical thickness corresponding to ¼±10% of the wavelength of the light to use.

5. The dust cover of claim 1, wherein said thin film has the five-layer structure consisting of a core layer, two intermediate layers bonded separately onto both sides of the core layer, and two outermost layers, the core layer is a thin film of fluoropolymer exhibiting an average transmittance of at least 90% for rays of wavelengths from 240 to 290 nm and an average transmittance of at least 93.5% for rays of wavelengths from 290 to 500 nm, when having a thickness of 10 μm, and having a refractive index of up to 1.42, the intermediate layers are thin films of a transparent polymer having a refractive index of at least 1.45, and the outermost layers are thin films of the above-defined fluoropolymer having a refractive index not higher than that of the core film.

6. The dust cover of claim 5, wherein the intermediate layers and the outermost layers have each an optical thickness corresponding to ¼±10% of the wavelength of the light to use.

7. The dust cover of claim 1, wherein said thin film has the five-layer structure consisting of a core layer, two intermediate layers bonded separately onto both sides of the core layer, and two outermost layers, the core layer is a nitrocellulose film having a thickness of 0.5 to 1.5 μm, and the intermediate layers are transparent polymer film having a refractive index of at least 1.57.

8. The dust cover of claim 7, wherein the intermediate layers and the outermost layers have each an optical thickness corresponding to ¼±10% of the wavelength of the light to use.

9. The dust cover of claim 2, wherein said fluoropolymer is a homopolymer of vinylidene fluoride or a vinylidene fluoride-tetrafluoroethylene copolymer having a vinylidene fluoride content of at least 50 mole %.

10. The dust cover of claim 1, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

11. The dust cover of claim 2, wherein said fluoropolymer is a homopolymer of vinylidene fluoride or a vinylidene fluoride-tetrafluoroethylene copolymer having a vinylidene fluoride contect of at least 50 mole %.

12. The dust cover of claim 3, wherein said fluoropolymer is a homopolymer of vinylidene fluoride or a vinylidene fluoride-tetrafluoroethylene copolymer having a vinylidene fluoride content of at least 50 mole %.

13. The dust cover of claim 4, wherein said fluoropolymer is a homopolymer of vinylidene fluoride or a vinylidene fluoride-tetrafluoroethlene copolymer having a vinylidene fluoride content of at least 50 mole %.

14. The dust cover of claim 5, wherein said fluoropolymer is a homopolymer of vinylidene fluoride or a vinylidene fluoride-tetrafluoroethylene copolymer having a vinylidene fluoride content of at least 50 mole %.

15. The dust cover of claim 6, wherein said fluoropolymer is a homopolymer of vinylidene fluoride or a vinylidene fluoride-tetrafluoroethylene copolymer having a vinylidene fluoride content of at least 50 mole %.

16. The dust cover of claim 7, wherein said fluoropolymer is a homopolymer of vinylidene fluoride or a vinylidene fluoride-tetrafluoroethylene copolymer having a vinylidene fluoride content of at least 50 mole %.

17. The dust cover of claim 8, wherein said fluoropolymer is a homopolymer of vinylidene fluoride or a vinylidene fluoride-tetrafluoroethylene copolymer having a vinylidene fluoride content of at least 50 mole %.

18. The dust cover of claim 2, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

19. The dust cover of claim 3, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

20. The dust cover of claim 4, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

21. The dust cover of claim 5, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

22. The dust cover of claim 6, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

23. The dust cover of claim 7, wherein said fluoropolymer is a tetrafluoroethylene (TFE)-hexafluoropropylene (HFP)-vinylidene fluoride (VdF) terpolymer having a TEF content of 35 to 65 mole % and an HFP:VdF molar ratio of from 1:1 to 1:2.3.

24. The dust cover of claim 7, wherein said fluoropolymer is a tetrafluoroethylene (TFE)-hexafluoropropylene (HFP)-vinylidene fluoride (VdF) terpolymer having a TFE content of 35 to 65 mole % and an HFP:VdF molar ratio of from 1:1 to 1:2.3.

* * * * *

UNITED STATES PATENT AND TRADEMARK OFFICE
CERTIFICATE OF CORRECTION

PATENT NO. : 4,657,805

DATED : April 14, 1987

INVENTOR(S) : Yasunori Fukumitsu et al.

It is certified that error appears in the above-identified patent and that said Letters Patent is hereby corrected as shown below:

Claim 7

Line 6, change "1.5" to --15--

Signed and Sealed this

Sixth Day of December, 1988

Attest:

DONALD J. QUIGG

Attesting Officer

Commissioner of Patents and Trademarks